(12) United States Patent
Xie et al.

(10) Patent No.: US 9,899,380 B2
(45) Date of Patent: Feb. 20, 2018

(54) FINFET STRUCTURE AND METHOD OF FORMING SAME

(71) Applicant: SEMICONDUCTOR MANUFACTURING INTERNATIONAL (SHANGHAI) CORPORATION, Shanghai (CN)

(72) Inventors: Xinyun Xie, Shanghai (CN); Ming Zhou, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/008,313

(22) Filed: Jan. 27, 2016

(65) Prior Publication Data

US 2016/0240530 A1 Aug. 18, 2016

(30) Foreign Application Priority Data

Feb. 17, 2015 (CN) .......................... 2015 1 0086441

(51) Int. Cl.
*H01L 21/266* (2006.01)
*H01L 27/088* (2006.01)
(Continued)

(52) U.S. Cl.
CPC .... *H01L 27/0886* (2013.01); *H01L 21/02238* (2013.01); *H01L 21/266* (2013.01);
(Continued)

(58) Field of Classification Search
CPC ..... H01L 29/785; H01L 21/266; H01L 21/76; H01L 21/823878; H01L 21/823481;
(Continued)

(56) References Cited

U.S. PATENT DOCUMENTS

2009/0278196 A1* 11/2009 Chang ............... H01L 21/82341
257/328
2013/0020640 A1* 1/2013 Chen ................. H01L 29/66795
257/347

(Continued)

*Primary Examiner* — Marc Armand
*Assistant Examiner* — Sue Tang
(74) *Attorney, Agent, or Firm* — Kilpatrick Townsend and Stockton LLP

(57) ABSTRACT

A method of forming a semiconductor device includes providing a semiconductor substrate. The semiconductor substrate includes fins formed thereon and a patterned hard mask layer formed on a top surface of the fins. The method further includes: forming an isolation material layer covering the semiconductor substrate, the fins, and the patterned hard mask layer; performing planarization of the isolation material layer, stopping at the patterned hard mask layer; and performing oxygen ion implantation to form an oxygen injection region within the fins and the isolation material layer; back-etching the isolation material layer, stopping above the oxygen injection region, to form a remaining portion of the isolation material layer exposing a portion of the fins; and performing thermal annealing to cause a thermal oxidation of a portion of the fins through oxygen ions in the oxygen injection region, thereby forming an oxide layer within the plurality of fins.

6 Claims, 6 Drawing Sheets

(51) Int. Cl.
*H01L 21/8234* (2006.01)
*H01L 21/265* (2006.01)
*H01L 21/8238* (2006.01)
*H01L 29/78* (2006.01)
*H01L 21/76* (2006.01)
*H01L 21/02* (2006.01)
*H01L 21/3115* (2006.01)
*H01L 21/84* (2006.01)

(52) U.S. Cl.
CPC .. *H01L 21/26506* (2013.01); *H01L 21/26533* (2013.01); *H01L 21/76* (2013.01); *H01L 21/823431* (2013.01); *H01L 21/823481* (2013.01); *H01L 21/823878* (2013.01); *H01L 29/785* (2013.01); *H01L 21/31155* (2013.01); *H01L 21/845* (2013.01)

(58) Field of Classification Search
CPC ......... H01L 21/26506; H01L 21/02238; H01L 21/845; H01L 21/31155
USPC ........................................................ 257/401
See application file for complete search history.

(56) References Cited

U.S. PATENT DOCUMENTS

| | | | |
|---|---|---|---|
| 2014/0285980 A1* | 9/2014 | Cappellani | H01L 21/76 361/748 |
| 2015/0102409 A1* | 4/2015 | Cheng | H01L 29/66795 257/347 |
| 2015/0357190 A1* | 12/2015 | Chien | H01L 21/02532 257/623 |

* cited by examiner

FINFET STRUCTURE AND METHOD OF FORMING SAME

CROSS-REFERENCES TO RELATED APPLICATIONS

This application claims priority to Chinese patent application No. 201510086441.2, filed on Feb. 17, 2015, the content of which is incorporated herein by reference in its entirety.

BACKGROUND OF THE INVENTION

The present invention relates to the field of semiconductor technology, and in particular relates to a semiconductor device and a method of forming the same.

With the continuing development of semiconductor technologies, the improvements in the performance of integrated circuits are mainly achieved through shrinking the size of the integrated circuit device and increasing its speed. Currently, because the pursuit of high-density, high performance and low cost in the semiconductor industry has progressed to nano-technology process node, especially when the semiconductor device dimensions have been reduced down to 22 nm or below, manufacturing and design challenges have led to three-dimensional designs such as the development of the fin field effect transistors (FinFET).

Compared with conventional planar transistors, FinFET devices have superior performance in terms of channel control and reduced shallow trench effect and so on. FIG. 1 shows a schematic perspective view of a typical FinFET. A typical FinFET includes: a semiconductor substrate 100; a fin 101 disposed on the semiconductor substrate 100; and a gate structure 102 disposed across and above the fin 101. For example, the gate structure 102 may include a gate dielectric layer and a gate electrode layer. The FinFET further includes an isolation layer 103 surrounding the bottom of the fin 101. In the FinFET, under the control of the gate electrode, a conductive channel is produced in three sides of the fin 101 (in the left, right, and top surfaces shown in FIG. 1). That is, the portion of the fin 101 located below the gate electrode serves as a channel region, and the source and drain regions are located on both sides of the channel region.

Since the bottom of the fin 101 is surrounded by a silicon oxide isolation layer 103, this portion of the fin 101 cannot be effectively controlled by the gate electrode. Thus, even in the off state, it is possible to form a current path between the source and drain regions through the bottom of the fin 101, causing a leakage current.

Therefore, there is a need for an improved semiconductor device and manufacturing method to reduce the leakage current in the fin bottom.

SUMMARY OF THE INVENTION

In one aspect of the present invention, a method of forming a semiconductor device is provided. According to an embodiment, the method includes providing a semiconductor substrate. The semiconductor substrate includes a plurality of fins formed thereon and a patterned hard mask layer formed on a top surface of the plurality of fins. The method further includes: forming by deposition an isolation material layer covering the semiconductor substrate, the plurality of fins, and the patterned hard mask layer; performing planarization of the isolation material layer, stopping at the patterned hard mask layer; and performing oxygen ion implantation to form an oxygen injection region within the plurality of fins and the isolation material layer. The method further includes: back-etching the isolation material layer, stopping above the oxygen injection region, to form a remaining portion of the isolation material layer exposing a portion of the plurality of fins; and performing thermal annealing to cause a thermal oxidation of a portion of the plurality of fins through oxygen ions in the oxygen injection region, thereby forming an oxide layer within the plurality of fins.

According to an embodiment, the plurality of fins and the patterned hard mask layer are formed by: forming a hard mask layer on a surface of the semiconductor substrate by deposition; forming a patterned photoresist layer on the hard mask layer, the patterned photoresist layer defining the plurality of fins; etching, using the patterned photoresist layer as a first mask, the hard mask layer to form the patterned hard mask layer; and etching, using the patterned hard mask layer as a second mask, the semiconductor substrate to form the plurality of fins.

According to an embodiment, the oxygen injection region is located below a predetermined exposed portion of the fins.

According to an embodiment, the bottom of the oxide layer is located near the bottom of the plurality of fins.

According to an embodiment, the top surface of the oxide layer is flush with or below the top surface of the remaining portion of the isolation material layer.

According to an embodiment, the isolation material layer includes silicon oxide.

In another aspect of the present invention, a semiconductor device is provided. The semiconductor device includes: a semiconductor substrate; a plurality of fins formed on the surface of the semiconductor substrate; an isolation material layer disposed on a portion of the surface of the semiconductor substrate between adjacent fins. The top surface of the isolation material layer is below the top surface of the plurality of fins. The semiconductor device further includes an oxide layer formed within the plurality of fins. The top surface of the oxide layer is flush with or below the top surface of the isolation material layer.

According to an embodiment, the oxide layer includes silicon oxide, and is formed by oxidation of a portion of the plurality of fins.

According to an embodiment, the oxide layer is located near the bottom of the plurality of fins.

In yet another aspect of the present invention, an electronic apparatus is provided. The electronic apparatus includes the above semiconductor device.

DETAILED DESCRIPTION OF THE INVENTION

Figure 1:
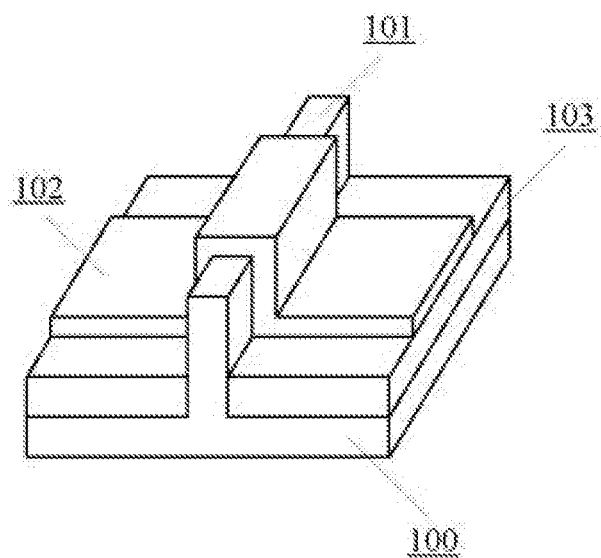
FIG. 1 shows a schematic perspective view of a typical FinFET.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc., do not denote any order, but rather the terms first, second, etc., are used to distinguish one element from another. Furthermore, the use of the terms a, an, etc., does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully hereinafter with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

First Embodiment

Figure 2A:
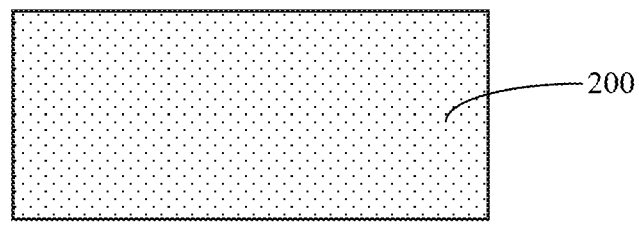
FIGS. 2A-2H are schematic cross-sectional views of a structure illustrating the intermediate steps of a method of forming a semiconductor device according to an embodiment of the present invention.
Figure 2B:
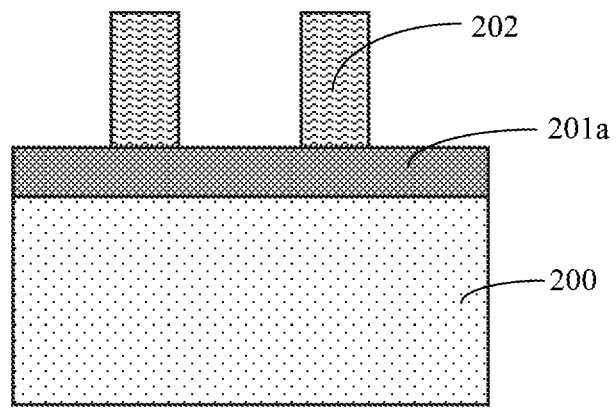
Figure 2C:
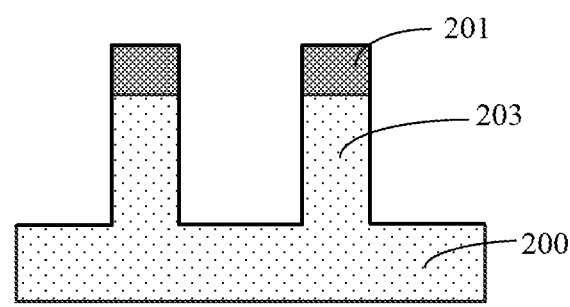
Figure 2D:
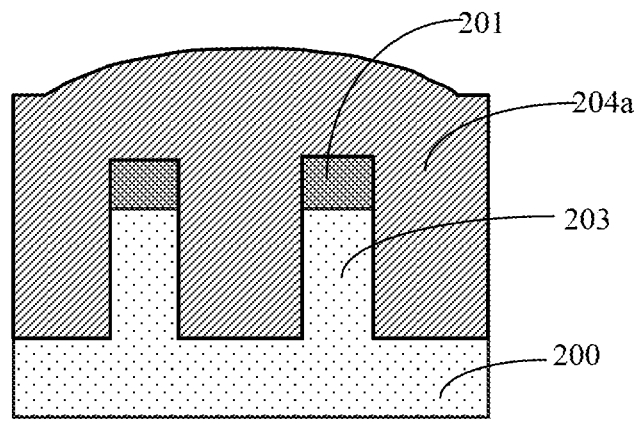
Figure 2E:
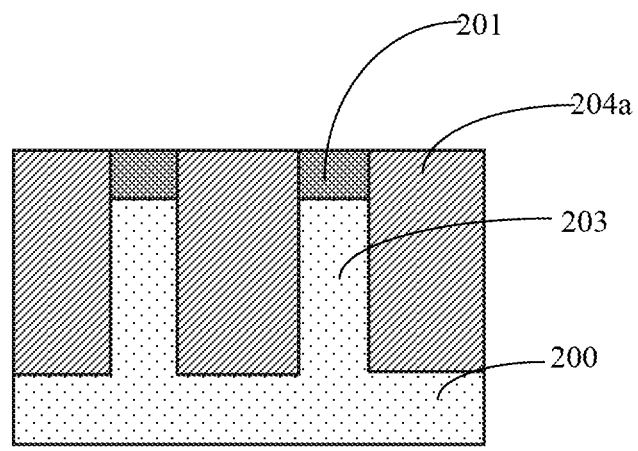
Figure 2F:
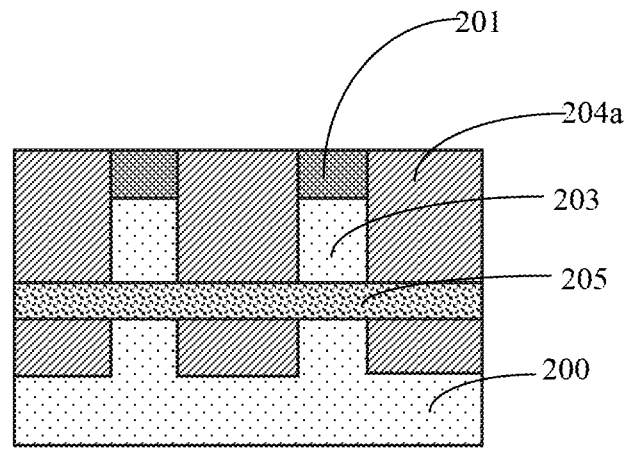
Figure 2G:
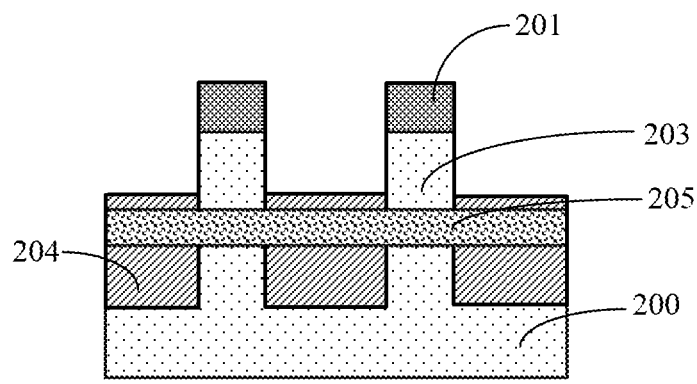
Figure 2H:
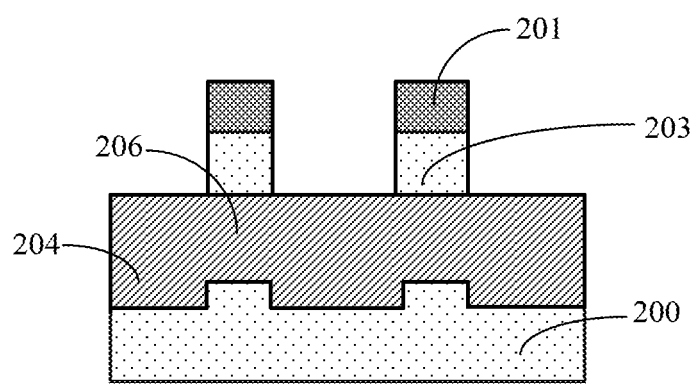
Figure 3:
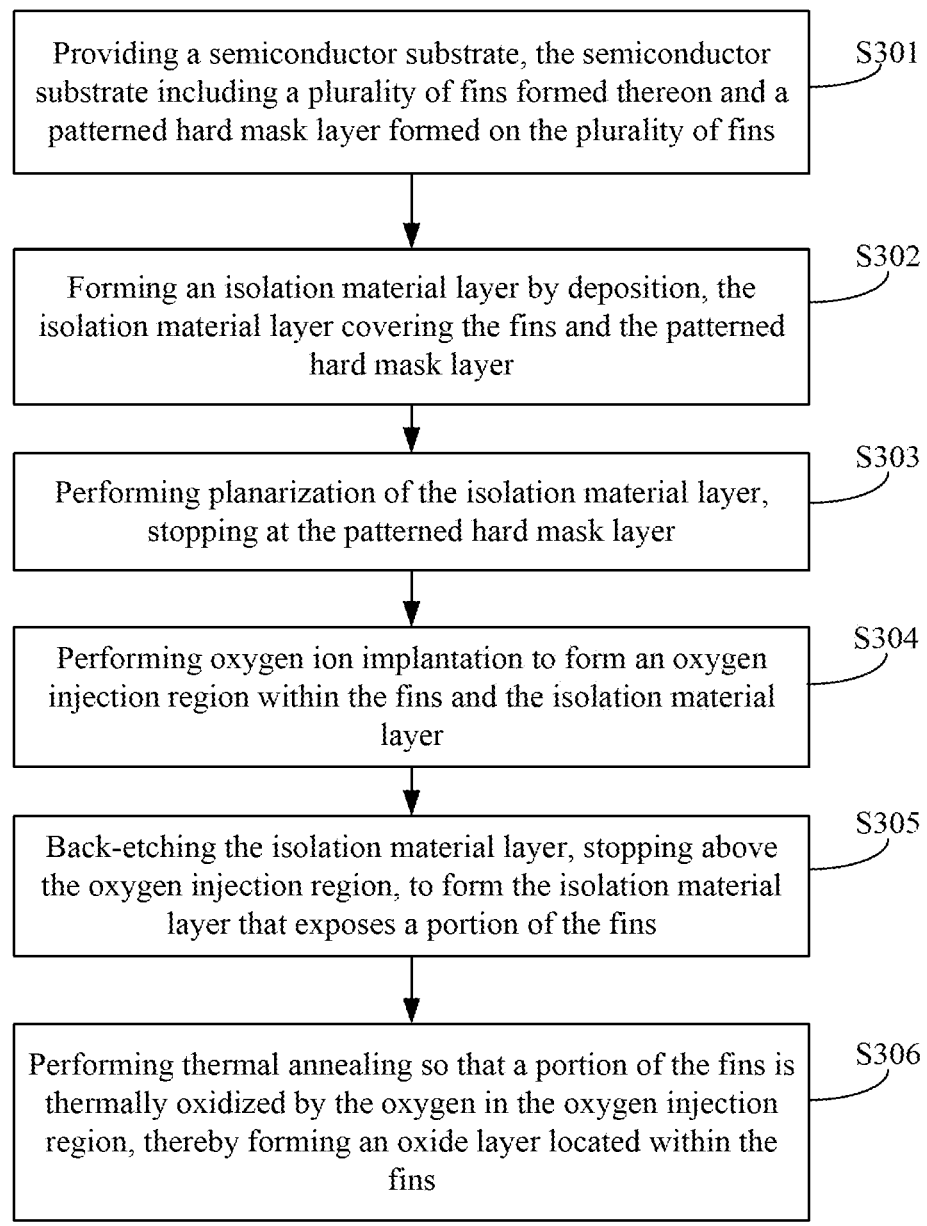
FIG. 3 is a simplified flowchart illustrating a method of forming a semiconductor device according to an embodiment of the present invention.

With reference to FIGS. 2A-2H and 3, a method of forming a semiconductor device according to an embodiment of the present invention is described below. FIGS. 2A-2H are schematic cross-sectional views of a structure illustrating the intermediate steps of a method of forming a semiconductor device according to an embodiment of the present invention. FIG. 3 is a simplified flowchart illustrating a method of forming a semiconductor device according to an embodiment of the present invention.

According to an embodiment, a method of forming a semiconductor device includes, at step S301, providing a semiconductor substrate 200. The semiconductor substrate 200 includes a plurality of fins 203 formed thereon and a patterned hard mask layer 201 formed on the plurality of fins 203, as shown in FIG. 2C.

The semiconductor substrate 200 may include at least one of the following materials: silicon, silicon-on-insulator (SOI), stacked silicon-on-insulator (SSOI), stacked silicon-germanium-on-insulator (S-SiGeOI), silicon-germanium-on-insulator (SiGeOI), germanium-on-insulator (GeOI), and the like. The semiconductor substrate 200 may include a source region.

With reference to FIGS. 2A-2C, a method of forming the fins 203 includes: providing a semiconductor substrate 200 as shown in FIG. 2A; and depositing a hard mask layer 201a on the surface of the semiconductor substrate 200, as shown in FIG. 1B.

The hard mask layer 201a may include silicon oxide, silicon nitride, or silicon oxynitride. According to an embodiment, the hard mask layer 201a includes sequentially stacked an oxide layer and a SiN layer. The oxide layer is preferably $SiO_2$. According to an embodiment, the hard mask layer 201a is formed by chemical vapor deposition (CVD), physical vapor deposition (PVD), atomic layer deposition (ALD), or the like.

As shown in FIG. 2B, the method of forming the fins 203 further includes forming a patterned photoresist layer 202 on the hard mask layer 201a. The patterned photoresist layer 202 defines the plurality of fins 203. As described below, the pattern in the photoresist layer 202 is transferred to the semiconductor substrate 200 to form the fins 203.

As shown in FIG. 2C, the method of forming the fins 203 further includes, using the photoresist layer 202 as a mask, etching the hard mask layer 201a to form the patterned hard mask layer 201; and using the patterned hard mask layer 201 as a mask, etching the semiconductor substrate 200 to form the plurality of fins 203.

The photoresist layer 202 may be consumed during the etching of the semiconductor substrate 200. Otherwise, the method of forming the fins 203 may further include removing the photoresist layer 202 after the etching of the semiconductor substrate 200 to form the fins 203.

It should be noted that the above only provides a method of forming the fins 203 according to an embodiment. Other methods may also be used to form the fins 203.

The method of forming a semiconductor device further includes, at step S302, forming an isolation material layer 204a by deposition. The isolation material layer 204a covers the fins 203 and the patterned hard mask layer 201, as shown in FIG. 2D.

The isolation material layer 204a may include an oxide, a nitride, a nitrogen oxide, or the like. Preferably, the material for the isolation material layer 204a includes silicon oxide. The isolation material layer 204a may be formed by chemical vapor deposition (CVD), physical vapor deposition (PVD), atomic layer deposition (ALD), or the like.

The method of forming a semiconductor device further includes, at step S303, performing planarization of the isolation material layer 204a, stopping at the patterned hard mask layer 201, as shown in FIG. 2E. One may use conventional surface planarization methods in the semiconductor manufacturing technologies. The planarization methods may include, for example, mechanical planarization and chemical mechanical polishing. Chemical mechanical polishing is more commonly used.

The method of forming a semiconductor device further includes, at step S304, performing oxygen ion implantation to form an oxygen injection region 205 within the fins 203 and the isolation material layer 204a, as shown in FIG. 2F.

According to an embodiment, the oxygen injection region 205 is located below the predetermined exposed portion of the fins 203. The location of the oxygen injection region 205 may be controlled by controlling the oxygen ion implantation energy and time and other parameters, so that the highest point of the oxygen injection region 205 is flush with the top surface of the isolation material layer 204 after the isolation material layer 204a has been etched to expose a portion of the fins 203 (as described below). Preferably, the oxygen injection region 205 is located within the isolation material layer 204, to ensure that the oxygen injection region 205 is not etched when the isolation material layer 204a is back-etched. According to embodiments of the present invention, the oxygen ion implantation dose ranges from about $1 \times 10^{16}$ $cm^{-2}$ to $5 \times 10^{17}$ $cm^{-2}$.

The method of forming a semiconductor device further includes, at step S305, back-etching the isolation material layer 204a, stopping above the oxygen injection region 205, to form the isolation material layer 204 that exposes a portion of the fins 203, as shown in FIG. 2G.

According to embodiments, either dry etching or wet etching may be used to back-etch the isolation material layer 204a. Dry etching may include anisotropic etching using carbon fluoride gas. Wet etching may use a hydrofluoric acid solution, e.g., buffer oxide etchant (BOE) or buffer solution of hydrofluoric acid (BHF).

The method of forming a semiconductor device further includes, at step S306, performing thermal annealing so that a portion of the fins 203 is thermally oxidized by the oxygen in the oxygen injection region 205, thereby forming an oxide layer 206 located within the fins 203, as shown in FIG. 2H.

Specifically, the thermal annealing process causes a thermal oxidation reaction between the oxygen in the oxygen injection region 205 and the portion of the fins 203 surrounding the oxygen injection region 205, thereby forming the oxide layer 206 located within the fins 203. The material of the oxide layer 206 depends on the material of the fins 203. For example, if the material of the fins 203 includes silicon, the oxide layer 206 formed after thermal annealing includes silicon oxide. In some embodiments, the thermal annealing temperature ranges from about 800° C. to about 1300° C., for example, 800° C., 900° C., 1000° C., 1100° C., 1200° C., 1300° C., or the like; the thermal annealing time ranges from about 0.5 hour to about 10 hours. The above parameters are only exemplary, and may be adjusted according to a predetermined thickness of the oxide layer 206. According to an embodiment, the top of the oxide layer 206 is flush with or below the top surface of the isolation material layer 204. Preferably, the bottom of the oxide layer 206 is located at the bottom of the fins 203. The oxide layer 206 near the bottom of the fins 203 may effectively prevent the problem of electrical leakage at the bottom of the fins 203. Finally, the method of forming a semiconductor device further includes removing the patterned hard mask layer 201 located above the fins 203.

This completes the description of the main steps of a method of forming a semiconductor device according to an embodiment of the present invention.

In summary, in the method of forming a semiconductor device according to an embodiment of the present invention, by performing oxygen ion implantation to the portion of the fins located below the isolation material layer and the subsequent thermal annealing, an oxide layer is formed near the bottom of the fins, thereby preventing electrical leakage at the bottom of the fins. Thus, the semiconductor device has improved reliability and performance.

Second Embodiment

Figure 4:
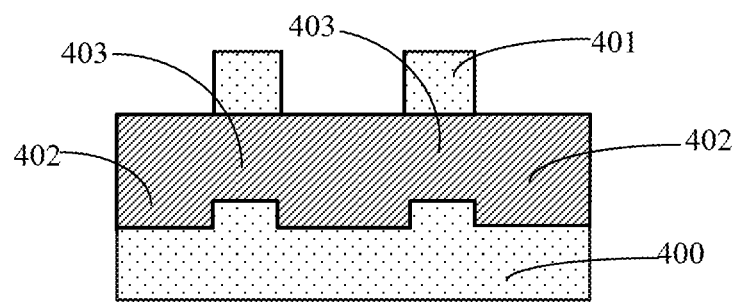
FIG. 4 is a cross-sectional view of a semiconductor device according to an embodiment of the present invention.

In another embodiment of the present invention, a semiconductor device is provided. The semiconductor device includes a FinFET device formed by the method described above. With reference to FIG. 4, the semiconductor device includes: a semiconductor substrate 400; a plurality of fins 401 located on the surface of the semiconductor substrate 400; an isolation material layer 402 located on the semiconductor substrate 400. The top surface of the isolation material layer 402 is lower than the top surface of the fins 401. The semiconductor device further includes an oxide layer 403 located within the fins 401. The top surface of the oxide layer 403 is flush with or below the top surface of the isolation material layer 402.

The semiconductor substrate 400 may include at least one of the following materials: silicon, silicon-on-insulator (SOI), stacked silicon-on-insulator (SSOI), stacked silicongermanium-on-insulator (S-SiGeOI), silicon-germanium-on-insulator (SiGeOI), germanium-on-insulator (GeOI), or the like.

According to an embodiment of the present invention, the isolation material layer 402 includes silicon oxide. The material for the oxide layer 403 includes an oxide obtained by oxidation of the fins 401. In one example, the material for the fins 401 includes silicon, and the material for the oxide layer 403 includes silicon oxide. Preferably, the oxide layer 403 is located at the bottom of the fins 401.

In the semiconductor device according to an embodiment of the present invention, because of the oxide layer formed near the bottom of the fins, electrical leakage at the bottom of the fins is prevented. Therefore, the semiconductor device has excellent reliability and performance.

Third Embodiment

According to yet another embodiment of the present invention, an electronic apparatus is provided. The electronic apparatus includes a semiconductor device and an electronic component assembly coupled to the semiconductor device. The semiconductor device includes a semiconductor device according to the second embodiment of the present invention, or a semiconductor device formed by the method according to the first embodiment of the present invention. The electronic component assembly may include any suitable electronic components.

Due to the use of the semiconductor device having excellent reliability and performance, the electronic apparatus also has the advantages described above.

The electronic apparatus may be a mobile phone, tablet PCs, laptops, netbooks, game consoles, TV receiver, VCD player, DVD player, GPS, camera, video camera, voice recorder, MP3, MP4, PSP players, or any other electronic products or equipment. It can also be an intermediate product having the above semiconductor device, for example: a mobile phone motherboard and the like.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features.

As such, the foregoing description should be considered as merely illustrative of the principles of the invention, and not in limitation thereof.

What is claimed is:

1. A method of forming a semiconductor device, the method comprising:
    providing a semiconductor substrate, the semiconductor substrate including a plurality of fins formed thereon and a patterned hard mask layer formed on a top surface of the plurality of fins;
    forming by deposition an isolation material layer covering the semiconductor substrate, the plurality of fins, and the patterned hard mask layer;
    performing planarization of the isolation material layer, stopping at the patterned hard mask layer;
    performing oxygen ion implantation to form an oxygen injection region within the plurality of fins and the isolation material layer;
    back-etching the isolation material layer, stopping above the oxygen injection region, to form a remaining portion of the isolation material layer exposing a portion of the plurality of fins; and
    performing thermal annealing to cause a thermal oxidation of a portion of the plurality of fins through oxygen ions in the oxygen injection region, thereby forming an oxide layer within the plurality of fins.

2. The method of claim 1, wherein the plurality of fins and the patterned hard mask layer are formed by:
    forming a hard mask layer on a surface of the semiconductor substrate by deposition;
    forming a patterned photoresist layer on the hard mask layer, the patterned photoresist layer defining the plurality of fins;
    etching, using the patterned photoresist layer as a first mask, the hard mask layer to form the patterned hard mask layer;
    etching, using the patterned hard mask layer as a second mask, the semiconductor substrate to form the plurality of fins.

3. The method of claim 1, wherein the oxygen injection region is located below a predetermined exposed portion of the fins.

4. The method of claim 1, wherein a bottom of the oxide layer is located near a bottom of the plurality of fins.

5. The method of claim 1, wherein a top surface of the oxide layer is flush with or below a top surface of the remaining portion of the isolation material layer.

6. The method of claim 1, wherein the isolation material layer comprises silicon oxide.

* * * * *